United States Patent [19]

Wataze et al.

[11] 4,212,019

[45] Jul. 8, 1980

[54] AVALANCHE PHOTODIODE

[75] Inventors: Manabu Wataze; Kazuhisa Takahashi; Saburo Takamiya; Shigeru Mitsui, all of Amagasaki, Japan

[73] Assignee: Mitsubishi Denki Kabushiki Kaisha, Tokyo, Japan

[21] Appl. No.: 920,639

[22] Filed: Jun. 29, 1978

[30] Foreign Application Priority Data

Jul. 19, 1977 [JP] Japan ................................ 52-86843

[51] Int. Cl.² .................... H01L 29/90; H01L 29/161
[52] U.S. Cl. ........................................ 357/13; 357/16; 357/30
[58] Field of Search ............................. 357/13, 16, 30

[56] References Cited

U.S. PATENT DOCUMENTS 4,083,062   4/1978   Ohuchi ................................ 357/13

*Primary Examiner*—Martin H. Edlow
*Attorney, Agent, or Firm*—Oblon, Fisher, Spivak, McClelland & Maier

[57] ABSTRACT

An avalanche photodiode comprises a photo-electric conversion region made of a semiconductor having an energy band gap smaller than the photon energy and a carrier multiplying region made of a semiconductor that differs from the semiconductor of the photo-electric conversion region. The different semiconductors for imparting superior functions to the regions are used to improve the quantum efficiency in the photo-electric conversion region and to decrease noise in the carrier multiplying region.

8 Claims, 3 Drawing Figures

AVALANCHE PHOTODIODE

BACKGROUND OF THE INVENTION

An avalanche photodiode (APD) used as a photodiode having multiplying effect is well-known.

The avalanche photodiode comprises a photo-electric conversion region which imparts a photo-electric effect after exposure to an incident light and a multiplying region which imparts an avalanche effect by applying a reverse bias voltage thereto. A desired distribution of impurities in the avalanche photodiode is dependent upon using electronsor positive holes as carriers for the multiplying step.

In order to impart the desired functions of the avalanche photodiode, it is necessary to form the photo-electric conversion region from a substance that produces a photo-electric effect upon exposure to incident light and the energy gap thereof should be smaller than the photon energy ($h\nu$).

On the other hand, the multiplying characteristic of the carrier region is dependent upon a ratio of the impact ionization coeffecient of electrons to that of positive holes in the multiplying region.

It is known that the avalanche photodiode uses a substance for providing $\alpha/\beta \gg 1$ or $\alpha/\beta \ll 1$ ($\alpha$ and $\beta$ are respectively the impact ionization coefficient of the electrons and that of the positive holes) and uses a carrier for providing a higher absolute value for the impact ionization coefficient.

However, the conventional avalanche photodiode is made of a single crystalline substance and it is essential that the avalanche photodiode have the photo-electric effect as one of its functions. As a result of this, it is necessary to select a substance having an energy gap smaller than the photon energy ($h\nu$). Accordingly, it has not been possible to effectively use a substance for providing $\alpha/\beta \gg 1$ or $\alpha/\beta \ll 1$—the impact ionization coefficient ratio in the carrier multiplying region.

That is, it has not been possible to provide an avalanche photodiode having high quantum efficiency and low noise, to provide a satisfactory charging effect after exposure to the incident light; and to provide $\alpha/\beta \gg 1$ or $\alpha/\beta \ll 1$—the impact ionization coefficient ratio.

SUMMARY OF THE INVENTION

It is an object of the present invention to improve the quantum efficiency of an avalanche photodiode upon exposure to incident light.

It is another object of the present invention to increase the ratio of the impact ionization coefficient of electrons to that of positive holes in the multiplying step of an avalanche photodiode.

It is the other object of the present invention to provide an avalanche photodiode having high efficiency and low noise.

DETAILED DESCRIPTION OF THE PREFERRED EMBODIMENTS

Figure 1:
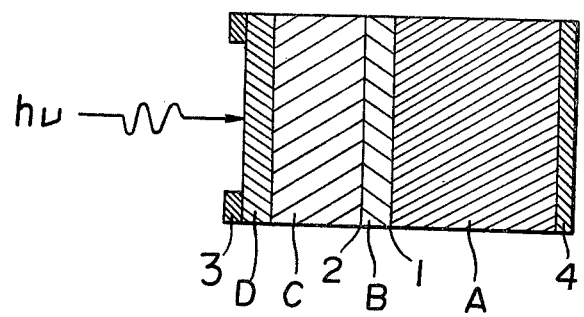
FIG. 1 is a sectional view of one embodiment of an avalanche photodiode according to the present invention.

The present invention overcomes the disadvantages of the conventional avalanche photodiode.

The avalanche photodiode of the present invention comprises: a photo-electric conversion region made of a semiconductor having an energy band gap that is smaller than the photon energy; and a carrier multiplying region made of a semiconductor that differs from the semiconductor of the photo-electric region and has $\alpha/\beta \gg 1$ or $\alpha/\beta \ll 1$ as an impact ionization coefficient ratio, whereby an avalanche photodiode having a high quantum efficiency and a low noise index in the multiplying step is obtained.

Referring to the figures in the drawing, the present invention will be illustrated.

In FIG. 1, the reference letter (A) designates a N type high impurity content semiconductor layer and (B) designates a P type impurity semiconductor layer having $\alpha/\beta \gg 1$ of an impact ionization coefficient ratio. The semiconductor layer (B) forms the carrier multiplying region and the semiconductor layers (A) and (B) are connected by P-N junction (1).

The semiconductor layers (A) and (B) are usually formed by using the same crystalline substrate, however, it is not always necessary to use the same crystalline substrate.

The reference (C) designates a semiconductor layer having an energy gap that is smaller than the photon energy upon exposure to the incident light and having a higher specific resistance than layer (B). The semiconductor layer (C) forms a photo-electric conversion region made of a P type impurity semiconductor substance that differs from the semiconductor layers (A), (B). The reference (2) designates a heterojunction for connecting the layer (B) and the layer (C). The reference (D) designates a P type high impurity content semiconductor layer connected to the semiconductor layer (C). The layer (D) can be made of the same semiconductor substance as that of the layer (C). The reference numerals (3) and (4) designate electrodes and the arrow line designates the incident light.

In accordance with the above-mentioned structure, an avalanche photodiode is obtained which has a high quantum efficiency and low noise; imparts a satisfactory photo-electric effect in the photo-electric conversion region (C); and has a high impact ionization coefficient ratio in the carrier multiplying region (B).

The substances used in the semiconductor layers (A), (B), (C) and (D) are dependent upon the characteristics of the incident light, e.g., wavelength.

Certain examples of semiconductor substances used for the semiconductor layers are illustrated below.

EXAMPLE 1

Semiconductor layer (A): N type high impurity content Si layer;
Semiconductor layer (B): P type Si layer;
Semiconductor layer (C): P type Ge layer;
Semiconductor layer (D): P type high impurity content Ge layer.

The avalanche photodiode made of substances the above exhibited a high quantum efficiency to incident light having a wavelength of 1.2 to 1.6 μm, as the energy gap of Ge was 0.66 (eV) (300° K.). The impact ionization coefficient ratio of Si in the carrier multiplying region was $10 \leq \alpha/\beta \leq 200$.

EXAMPLE 2

Semiconductor layer (A): N type high impurity content GaAs layer

Semiconductor layer (B): P type GaAs layer (carrier multiplying region)

Semiconductor layer (C): P type $GaAs_{1-x}Sb_x$ layer (photo-electric conversion region)

Semiconductor layer (D): P type high impurity content $GaAs_{1-x}Sb_x$ layer

The avalanche photodiode made of the above substances had an energy gap which depend upon the ratio of As to Sb. For example, the energy gap of $GaAs_{0.95}Sb_{0.05}$ (where x=0.05) was 1.3 (eV) and a high quantum efficiency was obtained for incident light having a wavelength of less than 0.95 μm.

The impact ionization coefficient ratio $\alpha/\beta$ of GaAs in the carrier multiplying region was $\alpha/\beta \simeq 4$.

EXAMPLE 3

Semiconductor layer (A): N type high impurity content Si layer;

Semiconductor layer (B): P type Si layer (carrier multiplying region)

Semiconductor layer (C): P type $Ge_xSi_{1-x}$ layer (photo-electric conversion region)

Semiconductor layer (D): P type high impurity content $Ge_xSi_{1-x}$ layer.

In the avalanche photodiode, the energy gap of the photo-electric conversion region (C) is in the range of 0.66 to 1.11 (eV) depending upon the ratio of Ge to Si; and high sensitivity is given to the wavelength that corresponds to the energy gap.

The ratio of $\alpha/\beta$ in the carrier multiplying region was $10 \leq \alpha/\beta \leq 200$.

In the above examples, the P type high impurity content semiconductor layer (D) is made of a substance that corresponds to the substance of the P type photo-electric conversion region (C). Thus, it is possible to use different substances for both layers.

When a substance with a small absorption coefficient to the incident light wavelength is selected as the P type high impurity content substance, absorption of the light in the semiconductor layer (D) is reduced.

Figure 2:
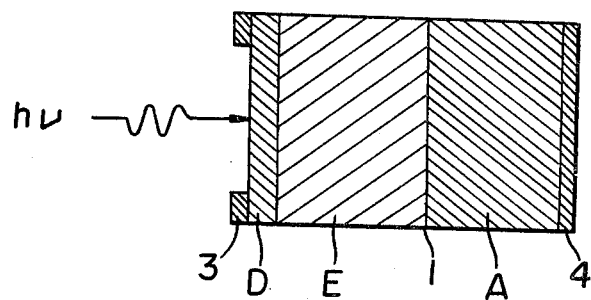
FIG. 2 is a sectional view of the other embodiment of an avalanche photodiode according to the present invention.
Figure 3:
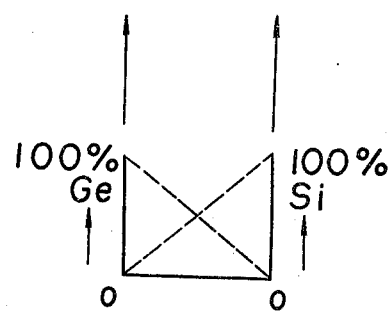
FIG. 3 is a graph showing a distribution of the compositions of the $Ge_xSi_{1-x}$ layer of FIG. 2.

In the embodiment of the avalanche photodiode shown in FIG. 2, the carrier multiplying region (B) and the photo-electric conversion region (C) are not clearly defined. As shown in the graph of FIG. 3, the compositions in the $Ge_xSi_{1-x}$ layer (E) are gradually varied in the direction of thickness. Accordingly the value of x is gradually varied to Ge 100% at the end of the photo-electric conversion region and Si 100% at the end of the carrier multiplying region.

The semiconductor layer (A) is a N type high impurity content Si layer and the semiconductor layer (D) is a P type high impurity content Ge layer.

In the above-mentioned embodiments, the incident light strikes the P type high impurity content semiconductor layer (D).

It is also effective to have the incident light enter from the side of the N type high impurity content semiconductor layer. In this case, the same effect can be attained by selecting a substance having a sufficient low light absorption coefficient to the incident light wavelength and having the ratio of $\alpha/\beta \gg 1$, for the carrier multiplying region (B).

In the above-mentioned embodiments, electrons are used as the carriers for the multiplying effect. Thus, it is also possible to use positive holes as carriers. In the latter case, it is preferable to select a substance having an impact ionization coefficient ratio of $\alpha/\beta \ll 1$. Such substances are easily obtainable. Thus, the present invention can be easily manufactured by following the above-described steps. Moreover, the present invention can be applied to other semiconductor devices utilizing the avalanche effect.

As described above, the avalanche photodiode of the present invention utilizes different semiconductor crystalline substances in the photo-electric conversion region and in the carrier multiplying region so as to impart satisfactory functions in these regions whereby the quantum efficiency in the photo-electric conversion region is improved and the noise in the carrier multiplying region is reduced.

What is claimed is:

1. An avalanche photodiode comprising:
  a first semiconductor layer of a selected conductivity type and being formed from a first semiconductor material; said first semiconductor layer being capable of converting incident radiation to electrons;
  a second semiconductor layer located adjacent the side of said first semiconductor layer that is exposed to incident radiation, having the same conductivity type and being of the same semiconductor material as said first semiconductor layer; said second semiconductor layer having a higher impurity density than said first semiconductor layer;
  a first electrode in operative contact with said second semiconductor material;
  a third semiconductor layer, functioning as a carrier multiplying region, located on the other side of said first semiconductor layer and having the same conductivity type as said first semiconductor layer; said third semiconductor layer being formed from a second semiconductor material;
  a fourth semiconductor layer of an opposite conductivity type located adjacent said third semiconductor; said fourth semiconductor layer being formed from said semiconductor material and having a higher impurity density than said third semiconductor layer; and a second electrode in operative contact with said fourth semiconductor layer.

2. An avalanche photodiode according to claim 1 wherein said first semiconductor layer, which functions as a photo-electric conversion region, is made of a P type Ge semiconductor material and said third semiconductor layer, which functions as a carrier multiplying region, is made of a P type Si semiconductor material.

3. An avalance photodiode according to claim 1 wherein said first semiconductor layer, which functions as a photo-electric conversion region is made of a P type $GaAs_{1-x}Sb_x$ semiconductor material and said third semiconductor layer, which functions as a carrier multiplying region, is made of a P type GaAs semiconductor material.

4. An avalanche photodiode according to claims 1 wherein said first semiconductor layer, which functions as a photo-electric conversion region, is made of a P type $Ge_xSi_{1-x}$ semiconductor material and said third semiconductor layer, which functions as a carrier multiplying region, is made of a P type Si semiconductor material.

5. An avalanche photodiode according to claim 1 wherein said first semiconductor material has an energy band gap that is less than the photon energy upon exposure to the incident radiation.

6. An avalanche photodiode according to claim 1 wherein said third semiconductor layer has an impact ionization coefficient ratio of $\alpha/\beta \gg 1$, with $\alpha$ being the impact ionization coefficient of electrons in the carrier multiplying region and $\beta$ being the impact ionization coefficient of positive holes in the carrier multiplying region.

7. An avalanche photodiode comprising:
- a first semiconductor layer of a first conductivity type and being formed from a first semiconductor material; said first semiconductor layer having a first region for converting incident radiation to electrons and a second region operating as a carrier multiplying region;
- a second semiconductor layer located adjacent the first region of said first semiconductor layer for converting incident radiation to electrons and being of the same conductivity type as said first semiconductor layer; said second semiconductor layer being formed from a second semiconductor material with a higher impurity density than said first semiconductor material;
- a first electrode in operative contact with said second semiconductor layer;
- a third semiconductor layer of an opposite conductivity type located adjacent to the second region of said first semiconductor layer; said third semiconductor layer being formed from a third semiconductor material with a higher impurity density than said first semiconductor material; and
- a second electrode in operative contact with said third semiconductor layer.

8. An avalanche photodiode according to claim 7 wherein the first semiconductor material is comprised of a combination of the two elements of Ge and Si with the area adjacent said second semiconductor layer being substantially Ge and the area adjacent said third semiconductor layer being substantially Si.